(12) United States Patent
Lin

(10) Patent No.: US 6,326,306 B1
(45) Date of Patent: Dec. 4, 2001

(54) METHOD OF FORMING COPPER DUAL DAMASCENE STRUCTURE

(75) Inventor: Chien-Hsing Lin, Taichung (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/783,872

(22) Filed: Feb. 15, 2001

(51) Int. Cl.[7] .................................................. H01L 21/44
(52) U.S. Cl. ........................ 438/687; 438/683; 438/685; 438/655; 438/656; 438/667; 438/668
(58) Field of Search .................................. 438/687, 683, 438/685, 655, 656, 664, 667, 668, 629, 630, 634

(56) References Cited

U.S. PATENT DOCUMENTS

| | | | |
|---|---|---|---|
| 5,130,274 | * 7/1992 | Harper et al. | 437/195 |
| 5,969,422 | * 10/1999 | Ting et al. | 257/762 |
| 6,013,578 | * 1/2000 | Jun | 438/687 |
| 6,197,688 | * 3/2001 | Simpson | 438/678 |
| 6,211,084 | * 4/2001 | Ngo et al. | 438/687 |
| 6,214,731 | * 4/2001 | Nogami et al. | 438/687 |
| 6,217,721 | * 4/2001 | Xu et al. | 204/192.17 |

* cited by examiner

Primary Examiner—John F. Niebling
Assistant Examiner—Olivia Luk

(57) ABSTRACT

A method of forming a copper dual damascene structure is disclosed. The method comprises forming copper lead lines and copper contacts simultaneously and selectively depositing tungsten layers on silicide layers formed on the active regions to complete the copper dual damascene structure and avoid the diffusion of copper into the active regions.

29 Claims, 4 Drawing Sheets

METHOD OF FORMING COPPER DUAL DAMASCENE STRUCTURE

BACKGROUND OF THE INVENTION

1. Field of the Invention

The present invention relates to a method of forming a copper dual damascene structure, and more particularly to a method of forming a copper dual damascene structure, wherein a selectively deposited tungsten layer is formed on a silicide layer as a blocking layer of a copper contact.

2. Description of the Related Art

Conventional metal oxide semiconductor (MOS) contact technology commonly utilizes tungsten as a contact plug material. Tungsten has many advantages, such as the proper thermal expansion coefficient which is close to the one of silicon, the much less electromigration trend and the excellent step coverage ability. However, the high resistivity causes the increasing of the undesired RC time delay of the device used tungsten contacts and degrades the performance of the device. FIG. 1 shows a cross-sectional view of a conventional MOS device and tungsten contacts. As shown in FIG. 1, the MOS device comprises source/drain regions 104a and 104b formed in a silicon substrate 100 and between shallow trench isolations 102a and 102b, a gate oxide layer 106, a gate electrode 108, spacers 110a and 102b, and silicide layers 112a and 112b. A dielectric layer 114, tungsten contacts 116a and 116b, and metal lines 118a and 118b are also shown in FIG. 1.

Owing to the high resistivity of tungsten, the tungsten contacts 116a and 116b are gradually unsatisfactory for the demand of the high speed of modern integrated circuits.

Dual damascene structures are more and more used amid the manufacture of the semiconductor device in view of fewer processing steps of their formation. In the dual damascene structures, the metal lines and the contacts are formed simultaneously. Lately, copper is used as the material of the lead lines and the contacts to replace tungsten for its much lower resistivity. However, once copper is used as the contact material, the barrier layer which is either a tantalum/tantalum nitride layer or a titanium/titanium nitride layer may not block copper effectively, and copper is very likely to diffuse into the active regions of the device during the processing phase and cause the failure of the device. Therefore, it is necessary to provide a novel contact technology to solve the problems of the conventional one mentioned above, and the method of the present invention is just the one.

SUMMARY OF THE INVENTION

It is therefore an object of the invention to form a contact structure of fewer formation steps by forming lead lines and contacts simultaneously.

It is another object of this invention to provide form a low resistance and hence low RC time delay contact structure.

It is a further object of this invention to form a reliable low resistance copper contact structure by selectively depositing a tungsten layer as a blocking layer to prevent copper from diffusing into the active regions of the device.

To achieve these objects, and in accordance with the purpose of the invention, the invention uses a method comprising forming copper lead lines and copper contacts simultaneously and selectively depositing tungsten layers on silicide layers formed on the active regions. Firstly, a silicon substrate having a source region and a drain region therein and a gate electrode thereon is provided. Then silicide layers are formed on the source region and the drain region. Moreover, two dielectric layers are formed sequentially over the substrate. Furthermore, trenches are formed by etching the upper dielectric layer to expose the lower dielectric layer. Then contact holes are formed by further etching the bottom of the trenches into the lower dielectric layer to expose the silicide layers. Moreover, a selective tungsten chemical vapor deposition process is performed over the substrate to form tungsten layers on the silicide layers. Next a barrier layer is conformally formed over the substrate. Finally, a copper layer is conformally formed over the barrier layer to form a dual damascene structure.

It is to be understood that both the foregoing general description and the following detailed description are exemplary and explanatory only and are not restrictive of the invention, as claimed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
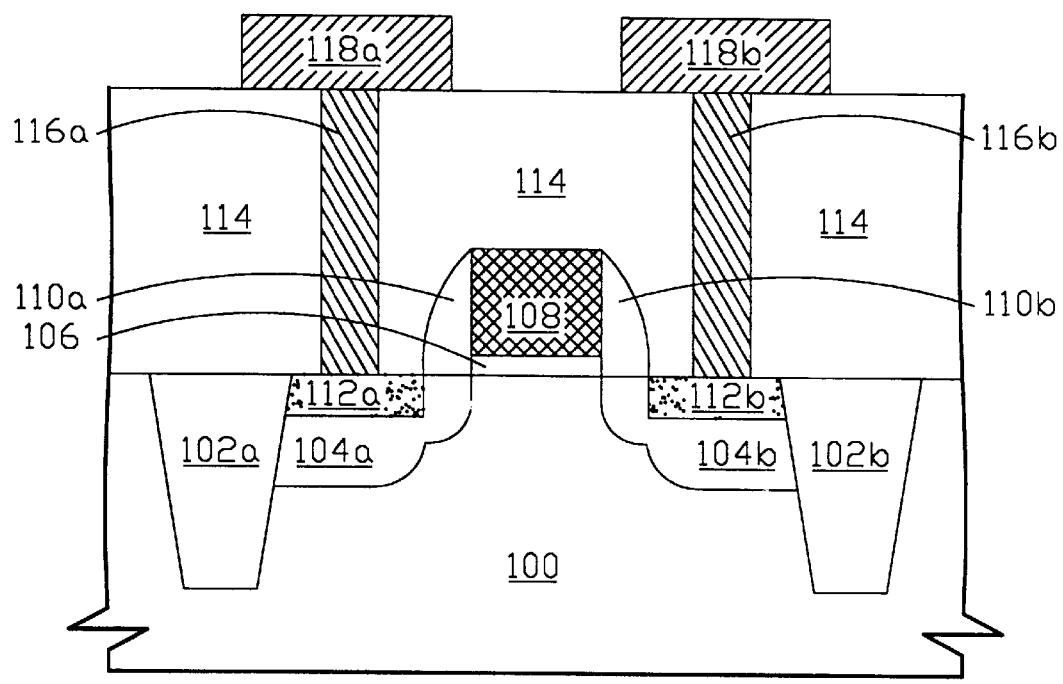
FIG. 1 shows a cross-sectional view of a conventional metal oxide semiconductor (MOS) device and tungsten contacts.
Figure 2A:
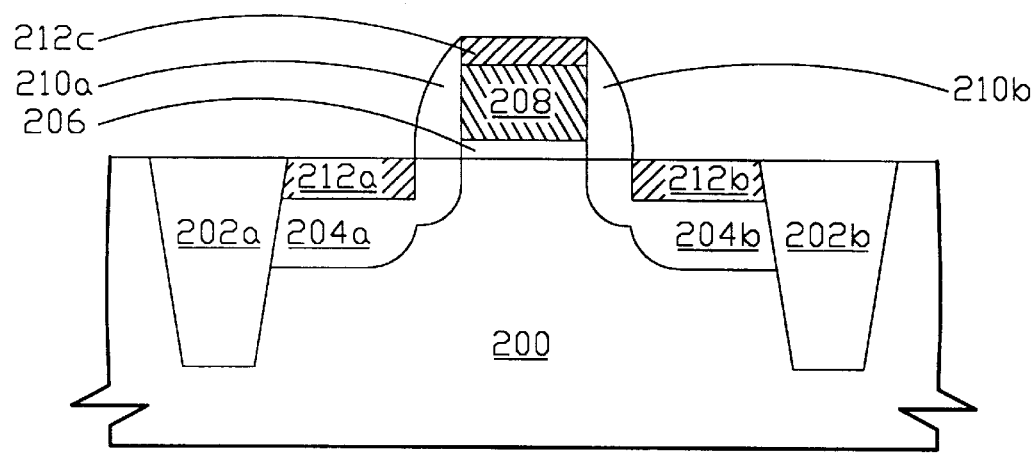
FIG. 2A shows a schematic cross-sectional diagram of a conventional MOS device.

Referring to FIG. 2A, a conventional metal oxide semiconductor device is shown. A substrate 200, which is preferably a silicon substrate with a <100> crystal orientation, is illustrated. Shallow trench isolation structures 202a and 202b can be formed by using a conventional method. Source/drain regions 204a and 204b, which can be formed by using conventional ion implantation and diffusion processes, can be either n-type or p-type doped region. A gate electrode comprising a conductive layer 208 and a gate oxide layer 206 is formed on the substrate 200 by using conventional processes in the art. The conductive layer 208 is preferably a polysilicon layer. Spacers 210a and 210b, which are preferably silicon nitride layers, are formed laterally adjacent the sidewalls of the gate electrode by using conventional methods. Moreover, silicide layers 212a and 212b are formed individually over the source/drain regions 204a and 204b. The silicide layers 212a and 212b can be either cobalt silicide ($CoSi_2$) layers or titanium silicide ($TiSi_2$) layers and are preferably cobalt silicide layers. For the formation of cobalt silicide layers, a cobalt layer is firstly deposed over the substrate 200. Then a rapid thermal processing is performed to form the cobalt silicide layers.

Figure 2B:
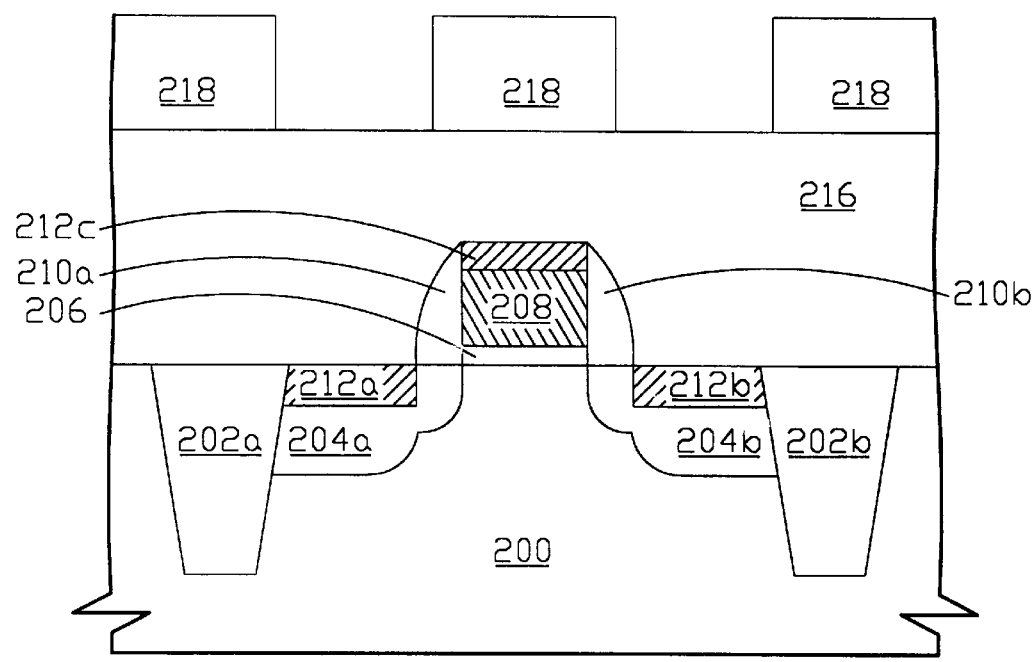
FIG. 2B shows a result of sequentially forming two dielectric layers over the MOS device and anisotropically etching the upper dielectric layer to expose the lower one.

Referring to FIG. 2B, a dielectric layer 216 and a dielectric layer 218 are formed sequentially over the substrate 200. Usually, an etching stop layer, which is preferably a silicon nitride layer, is formed between the dielectric layers 216 and 218. The dielectric layer 216, which is also known as an interlayer dielectric (ILD) layer formed by using a conventional method in the art, can be either a spin-on glass (SOG) layer or a borophosphosilicate glass (BPSG) layer having a thickness between about 4000 angstrom to about 5000 angstrom. The dielectric layer 216 is then planarized via a chemical mechanical polishing (CMP)process. The dielectric layer 218, which is also known as an intermetal dielectric layer (IMD) layer formed via conventional methods, can be a fluorosilicate glass (FSG) layer, a hydrogen silsesquioxane (HSQ) layer, a methyl silsesquioxane (MSQ) layer and a benzocyclobutene (BCB )layer having a thickness between about 2500 angstrom to about 2600 angstrom. The dielectric layer 218 is then planarized by a CMP process. To form contact of a dual damascene structure, the dielectric layer 218 is etched through to expose the dielectric layer 216 via conventional photolithography and etching processes, and trenches having a width between about 0.24 microns to about 2 microns are formed. The etching process is preferably a reactive ion etching (RIE) process.

Figure 2C:
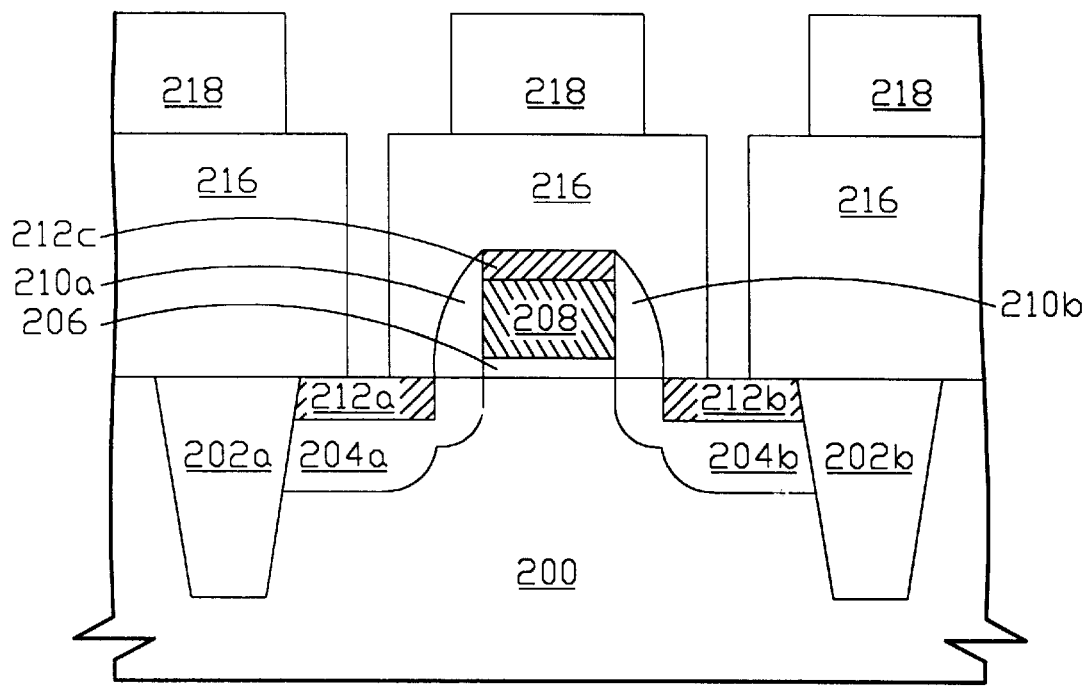
FIG. 2C shows a result of further anisotropically etching the lower dielectric layer to expose the silicide layers.

Referring to FIG. 2C, the bottom of the trenches are further etched into the dielectric layer 216 to form contact holes having a diameter or width of about 0.2 micron and expose the silicide layers 212a and 212b respectively by using conventional photolithography and etching processes. As the trenches shown in FIG. 2B, the contact holes are preferably formed via a RIE process.

Figure 2D:
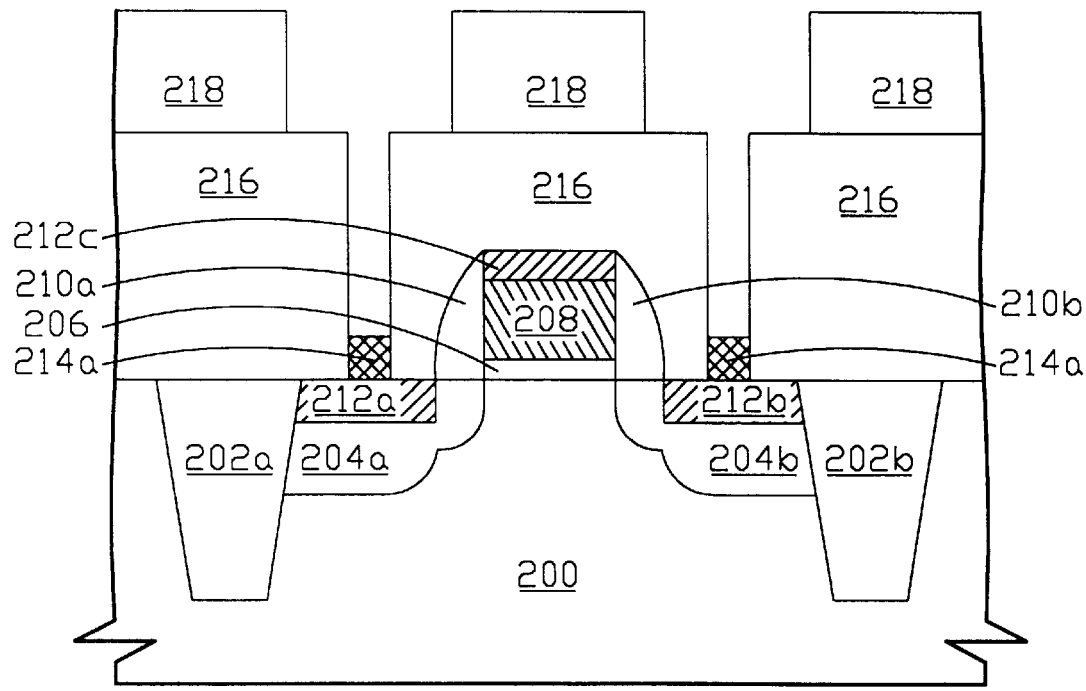
FIG. 2D shows a result of selectively depositing tungsten layers on the structure shown in FIG. 2C.

Referring to FIG. 2D, tungsten layers 214a and 214b are selectively deposited on the exposed silicide layers 212a and 212b by using a selective tungsten chemical vapor deposition (CVD) process occurred only on a silicon-contained layer at a temperature between about 275° C. to about 325° C. The precursors of the selective tungsten CVD process comprise tungsten fluoride ($WF_6$) and silane ($SiH_4$). The selectively deposited tungsten layers are formed through a silane reduction reaction. Furthermore, the tungsten layers 214a and 214b have a thickness between about 100 angstrom to about 200 angstrom.

Figure 2E:
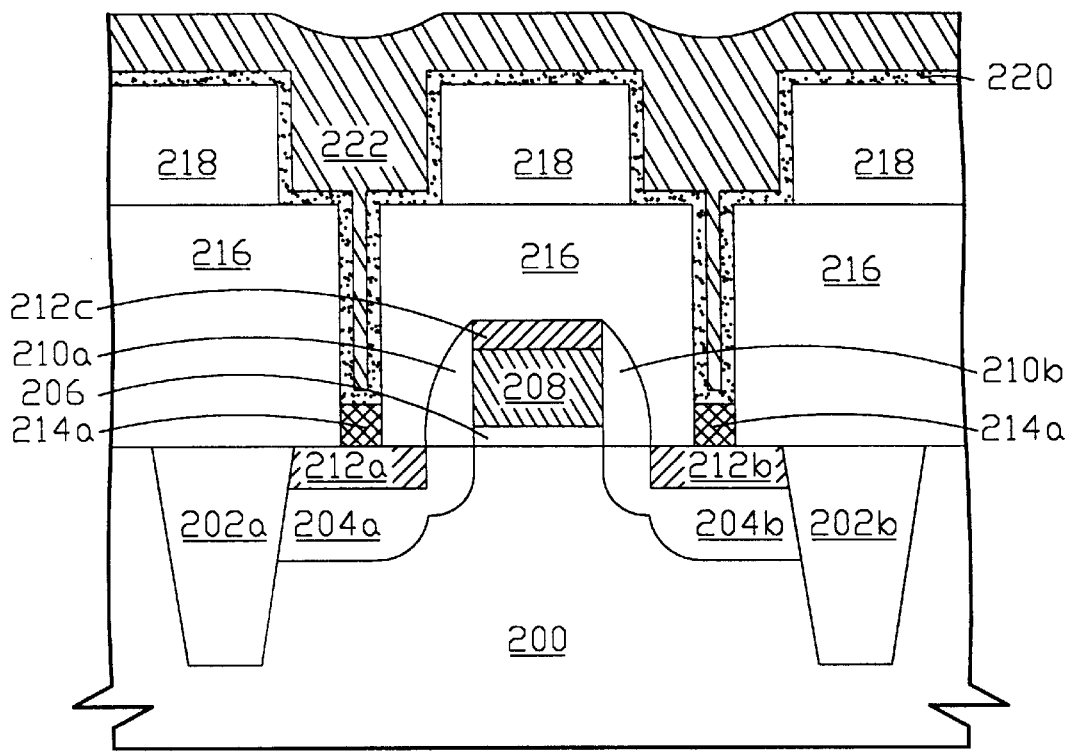
FIG. 2E shows a result of sequentially and conformally forming a barrier layer and a copper layer over the structure shown in FIG. 2D.

Referring to FIG. 2E, a barrier layer 220 and a copper layer 222 are conformally formed over the structure shown in FIG. 2D. The barrier layer 220 can be either a tantalum nitride (TaN) layer or a titanium nitride (TiN) layer having a thickness between about 200 angstrom to about 400 angstrom formed by using conventional physical vapor deposition (PVD ) or chemical vapor deposition (CVD ) processes. Moreover, a Ta/TaN layer or a Ti/TiN layer are more commonly used. The copper layer 222 having a thickness between about 10000 angstrom to about 40000 angstrom is formed by using a electrochemical deposition (ECD )process utilized copper sulfate as a source. Usually, before performing the ECD process, an underlying copper seed layer is previously deposited via a PVD process.

Figure 2F:
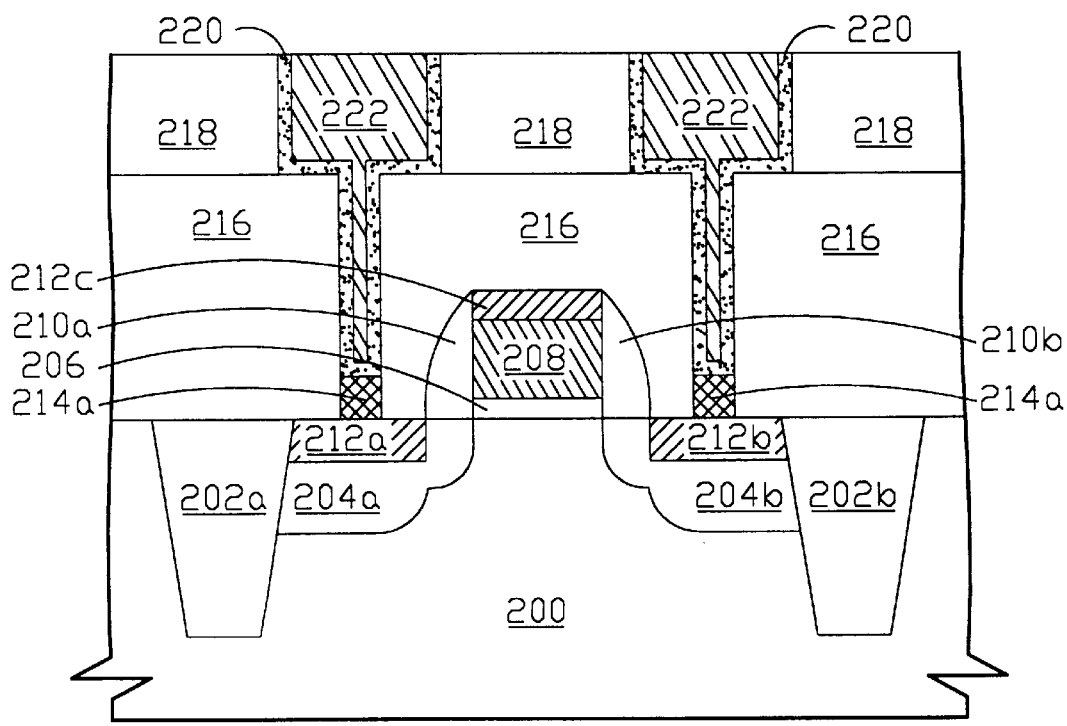
FIG. 2F shows a result of removing the portions of the copper layer and the barrier layer on the top surface of the upper dielectric layer to complete the dual damascene structure.

Referring to FIG. 2F, to complete the dual damascene structure, the portions of the copper layer 222 and the barrier layer 220 on the top surface of the dielectric layer 218 are removed via a conventional CMP process. The dual damascene structure formed via the method of this invention set forth has many advantages. First of all, by simultaneously forming the copper contacts and the copper lead lines, fewer process steps are needed. Secondly, because the copper contacts has a much lower resistance than the tungsten contacts, the RC time delay of the device can be effectively reduced and hence the performance of the device can be apparently improved. This can be done because selectively deposited tungsten layers are previously formed as barriers to prevent copper from diffusing into the active regions of the device and damaging the active regions by degrading the breakdown voltage.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of forming a copper dual damascene structure, said method comprising:

providing a silicon substrate having a source region and a drain region therein;

forming a silicide layer on said source region and said drain region;

forming a first dielectric layer over said silicon substrate;

forming a second dielectric layer over said first dielectric layer;

forming a plurality of trenches into said second dielectric layer to expose said first dielectric layer;

forming a plurality of contact holes into said first dielectric layer to expose said silicide layer, wherein said contact holes individually connect said trenches;

performing a selective tungsten chemical vapor deposition process over said silicon substrate to form a tungsten layer on said silicide layer;

conformally forming a barrier layer over said silicon substrate;

and conformally forming a copper layer over said barrier layer to form the copper dual damascene structure.

2. The method according to claim 1, wherein said silicide layer comprises a cobalt silicide layer and a titanium silicide layer.

3. The method according to claim 1, wherein said first dielectric layer comprises a spin-on glass layer and a borophosphosilicate glass layer having a thickness between about 4000 angstrom to about 5000 angstrom.

4. The method according to claim 1, wherein said second dielectric layer comprises a fluorosilicate glass layer, a hydrogen silsesquioxane layer, a methyl silsesquioxane layer and a benzocyclobutene layer having a thickness between about 2500 angstrom to about 2600 angstrom.

5. The method according to claim 1, wherein said tungsten layer has a thickness between about 100 angstrom to about 200 angstrom.

6. The method according to claim 1, wherein the precursors of said selective tungsten chemical vapor deposition process comprise tungsten fluoride ($WF_6$) and silane.

7. The method according to claim 1, wherein said selective tungsten chemical vapor deposition process is performed at about 275° C. to about 325° C.

8. The method according to claim 1, wherein said barrier layer comprising a tantalum nitride (TaN) layer and a titanium nitride layer has a thickness between about 200 angstrom to about 400 angstrom.

9. The method according to claim 1, wherein said barrier layer is formed by using a physical vapor deposition process.

10. The method according to claim 1, wherein said barrier layer is formed by using a chemical vapor deposition process.

11. A method of forming a copper dual damascene structure, said method comprising:

providing a silicon substrate having a source region and a drain region therein;

forming a silicide layer on said source region and said drain region;

forming a first dielectric layer having a thickness between about 4000 angstrom to about 5000 angstrom over said silicon substrate;

forming a second dielectric layer having a thickness between about 2500 angstrom to about 2600 angstrom over said first dielectric layer;

forming a plurality of trenches into said second dielectric layer to expose said first dielectric layer;

forming a plurality of contact holes into said first dielectric layer to expose said silicide layer, wherein said contact holes individually connect said trenches;

performing a selective tungsten chemical vapor deposition process over said silicon substrate to form a tungsten layer on said silicide layer;

conformally forming a barrier layer over said silicon substrate;

and conformally forming a copper layer over said barrier layer to form the copper dual damascene structure via an electrochemical deposition process.

12. The method according to claim 11, wherein said silicide layer comprises a cobalt silicide layer and a titanium silicide layer.

13. The method according to claim 11, wherein said first dielectric layer comprises a spin-on glass layer and a borophosphosilicate glass layer.

14. The method according to claim 11, wherein said second dielectric layer comprises a fluorosilicate glass layer, a hydrogen silsesquioxane layer, a methyl silsesquioxane layer and a benzocyclobutene layer.

15. The method according to claim 11, wherein said tungsten layers have a thickness between about 100 angstrom to about 200 angstrom.

16. The method according to claim 11, wherein the precursors of said selective tungsten chemical vapor deposition process comprise tungsten fluoride ($WF_6$) and silane.

17. The method according to claim 11, wherein said selective tungsten chemical vapor deposition process is performed at about 275° C. to about 325° C.

18. The method according to claim 11, wherein said barrier layer comprising a tantalum nitride (TaN) layer and a titanium nitride layer has a thickness between about 200 angstrom to about 400 angstrom.

19. The method according to claim 11, wherein said barrier layer is formed by using a physical vapor deposition process.

20. The method according to claim 11, wherein said barrier layer is formed by using a chemical vapor deposition process.

21. A method of forming a copper dual damascene structure, said method comprising:

providing a silicon substrate having a source region and a drain region therein;

forming a cobalt silicide layer on said source region and said drain region;

forming a first dielectric layer over said silicon substrate;

forming a second dielectric layer over said first dielectric layer;

forming a plurality of trenches into said second dielectric layer to expose said first dielectric layer;

forming a plurality of contact holes into said first dielectric layer to expose said silicide layer, wherein said contact holes individually connect said trenches;

performing a selective tungsten chemical vapor deposition process over said silicon substrate to form a tungsten layer on said cobalt silicide layer;

conformally forming a tantalum nitride layer over said silicon substrate;

and conformally forming a copper layer over said tantalum nitride layer to form the copper dual damascene structure by using an electro-chemical deposition process.

22. The method according to claim 21, wherein said first dielectric layer comprises a spin-on glass layer and a borophosphosilicate glass layer having a thickness between about 4000 angstrom to about 5000 angstrom.

23. The method according to claim 21, wherein said second dielectric layer comprises a fluorosilicate glass layer, a hydrogen silsesquioxane layer, a methyl silsesquioxane layer and a benzocyclobutene layer having a thickness between about 2500 angstrom to about 2600 angstrom.

24. The method according to claim 21, wherein said tungsten layer has a thickness between about 100 angstrom to about 200 angstrom.

25. The method according to claim 21, wherein the precursors of said selective tungsten chemical vapor deposition process comprise tungsten fluoride ($WF_6$) and silane.

26. The method according to claim 21, wherein said selective tungsten chemical vapor deposition process is performed at about 275° C. to about 325° C.

27. The method according to claim 21, wherein said tantalum nitride layer has a thickness between about 200 angstrom to about 400 angstrom.

28. The method according to claim 21, wherein said tantalum nitride layer is formed by using a physical vapor deposition process.

29. The method according to claim 21, wherein said tantalum nitride layer is formed by using a chemical vapor deposition process.

* * * * *